(12) United States Patent
Tomioka

(10) Patent No.: US 7,652,885 B2
(45) Date of Patent: Jan. 26, 2010

(54) ELECTRONIC DEVICE, COOLING DEVICE AND LOOP HEAT PIPE

(75) Inventor: Kentaro Tomioka, Sayama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/349,410

(22) Filed: Jan. 6, 2009

(65) Prior Publication Data
US 2009/0244846 A1 Oct. 1, 2009

(30) Foreign Application Priority Data
Mar. 27, 2008 (JP) ............................. 2008-083435

(51) Int. Cl.
*H05K 7/20* (2006.01)
*F28D 15/04* (2006.01)

(52) U.S. Cl. ............ 361/700; 165/104.33; 165/104.26; 361/695; 361/702

(58) Field of Classification Search ............ 165/104.26, 165/104.33; 361/679.52, 700
See application file for complete search history.

(56) References Cited

U.S. PATENT DOCUMENTS

| | | | | |
|---|---|---|---|---|
| 3,528,494 | A * | 9/1970 | Levedahl | 165/104.26 |
| 5,076,351 | A * | 12/1991 | Munekawa et al. | 165/104.21 |
| 6,529,377 | B1 * | 3/2003 | Nelson et al. | 361/699 |
| 6,880,626 | B2 * | 4/2005 | Lindemuth et al. | 165/104.26 |
| 6,999,314 | B2 * | 2/2006 | Tonosaki et al. | 361/700 |
| 7,372,697 | B2 * | 5/2008 | Tomioka | 361/699 |
| 2002/0067598 | A1 * | 6/2002 | Sathe et al. | 361/700 |
| 2004/0075181 | A1 * | 4/2004 | Hara | 261/99 |
| 2007/0006994 | A1 * | 1/2007 | Liu et al. | 165/104.26 |
| 2007/0256814 | A1 * | 11/2007 | Moon et al. | 165/80.4 |
| 2008/0128898 | A1 * | 6/2008 | Henderson et al. | 257/713 |
| 2009/0097206 | A1 * | 4/2009 | Tomioka | 361/701 |
| 2009/0219695 | A1 * | 9/2009 | Tomioka | 361/700 |

FOREIGN PATENT DOCUMENTS

| | | |
|---|---|---|
| JP | 11-190596 | 7/1999 |
| JP | 2004-077051 | 11/2004 |
| JP | 2004-324906 | 11/2004 |
| JP | 2007-163076 | 6/2007 |
| JP | 2008-051407 | 3/2008 |

OTHER PUBLICATIONS

Japanese Patent Application 2008-083435, Notice of Reasons for Rejection, mailed Mar. 31, 2009, (English translation).

* cited by examiner

*Primary Examiner*—Gregory D Thompson
(74) *Attorney, Agent, or Firm*—Blakely, Sokoloff, Taylor & Zafman LLP (57) ABSTRACT

According to one embodiment, an electronic device includes a housing, a heat generating part contained in the housing, and a loop heat pipe contained in the housing. The loop heat pipe includes a heat receiving portion, a heat radiating portion, a vapor flow path and a liquid return flow path. The heat receiving portion includes a first region connected to the liquid return flow path and provided with a wick, and a second region formed to be hollow, connected to the vapor flow path. The heat receiving portion is thermally connected to the heat generating part at a position across the first region and the second region.

8 Claims, 7 Drawing Sheets

ELECTRONIC DEVICE, COOLING DEVICE AND LOOP HEAT PIPE

CROSS-REFERENCE TO RELATED APPLICATIONS

This application is based upon and claims the benefit of priority from Japanese Patent Application No. 2008-083435, filed Mar. 27, 2008, the entire contents of which are incorporated herein by reference.

BACKGROUND

1. Field

One embodiment of the present invention relates to an electronic device equipped with a loop heat pipe for cooling a heat generating part, a cooling device and a loop heat pipe.

2. Description of the Related Art

For example, Japanese patent application, Jpn. Pat. Appln. KOKAI Publication No. 11-190596 discloses a loop-shaped flat-type heat pipe having the following structure. This loop heat pipe includes a box-shaped container inside which a groove wick is provided, a recessed wall recessed in the vicinity of a central portion of the container and brought into contact with an opposing wall and a working fluid injected in the container. The recessed wall has a length shorter than an effective length of the container. With this structure, the inside of the container is formed to have a loop shape. In this heat pipe, the working fluid is nucleate-boiled in the heat receiving section to form vapor bubbles and at the same time, pressure oscillatory wave is generated. All of the vapor bubbles which have taken latent heat are expanded and contracted by the pressure oscillatory wave and gradually move towards the heat radiating section. Due to the movement of the vapor bubbles, the heat transport is carried out.

However, the conventional heat pipe described above takes such a structure that vapor bubbles are transported by pressure oscillatory wave, which has a low heat transport efficiency. Further, a gas phase portion of the working fluid and a liquid phase portion thereof are allowed to pass through the same path. With this structure, the heat of the gas phase portion of the working fluid is transmitted to the liquid phase of the liquid, and thus a part of the heat being transported is in some cases returned to the heat receiving portion, thereby lowering the efficiency of the heat transport.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, an electronic device includes a housing, a heat generating part contained in the housing, and a loop heat pipe contained in the housing. The loop heat pipe includes a heat receiving portion, a heat radiating portion, a vapor flow path and a liquid return flow path. The heat receiving portion includes a first region connected to the liquid return flow path and provided with a wick, and a second region formed to be hollow, connected to the vapor flow path. The heat receiving portion is thermally connected to the heat generating part at a position across the first region and the second region.

Figure 1:
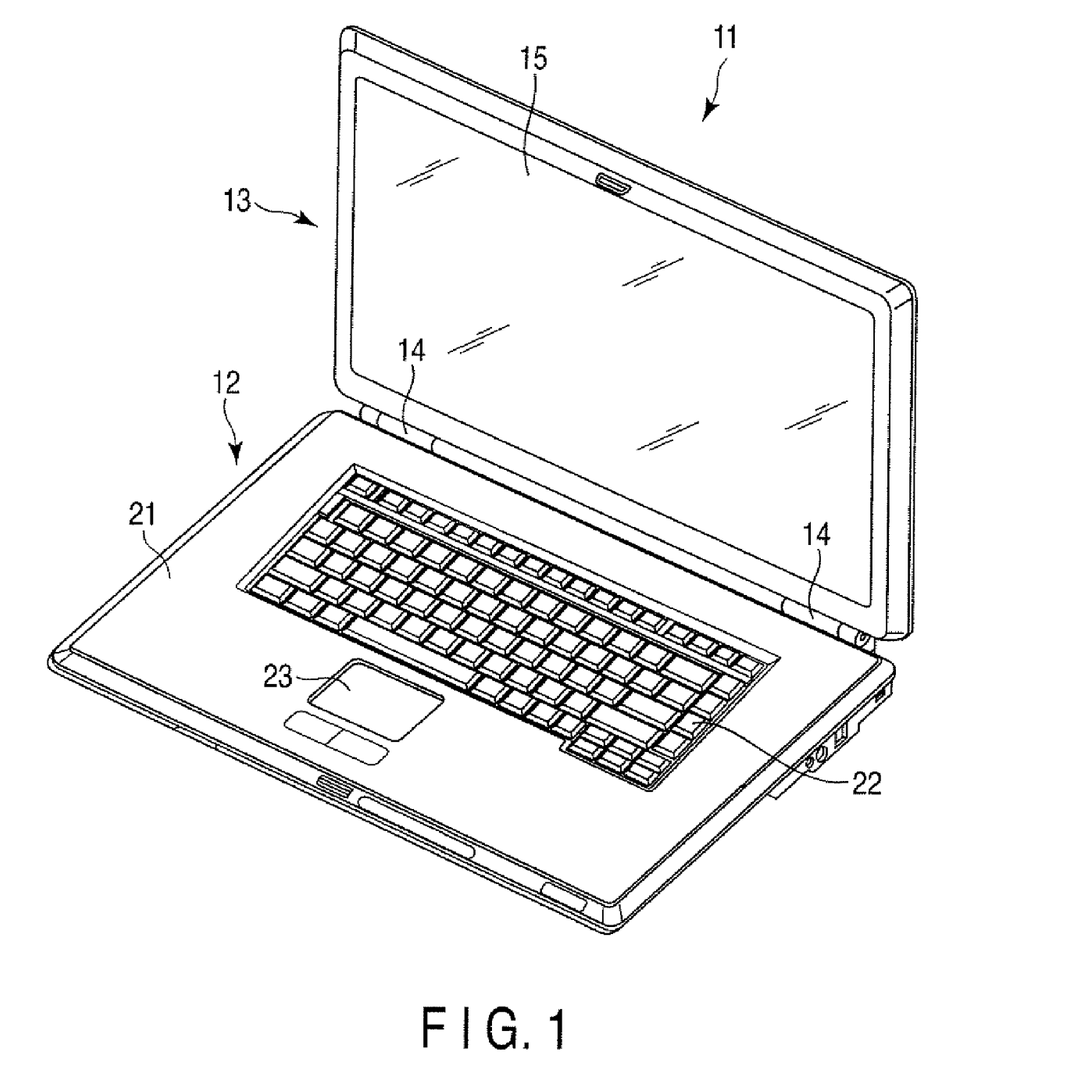
FIG. 1 is an exemplary perspective view showing a portable computer, which is an example of the electronic device according to the first embodiment.

The first embodiment of the electronic device will now be described with reference to FIGS. 1 to 6. As shown in FIG. 1, a portable computer 11, which is an example of the electronic device, includes a main body unit 12, a display unit 13 and a hinge mechanism 14 provided between the main body unit 12 and the display unit 13. The hinge mechanism 14 supports the display unit 13 so as to be pivotable with respect to the main body unit 12.

Figure 2:
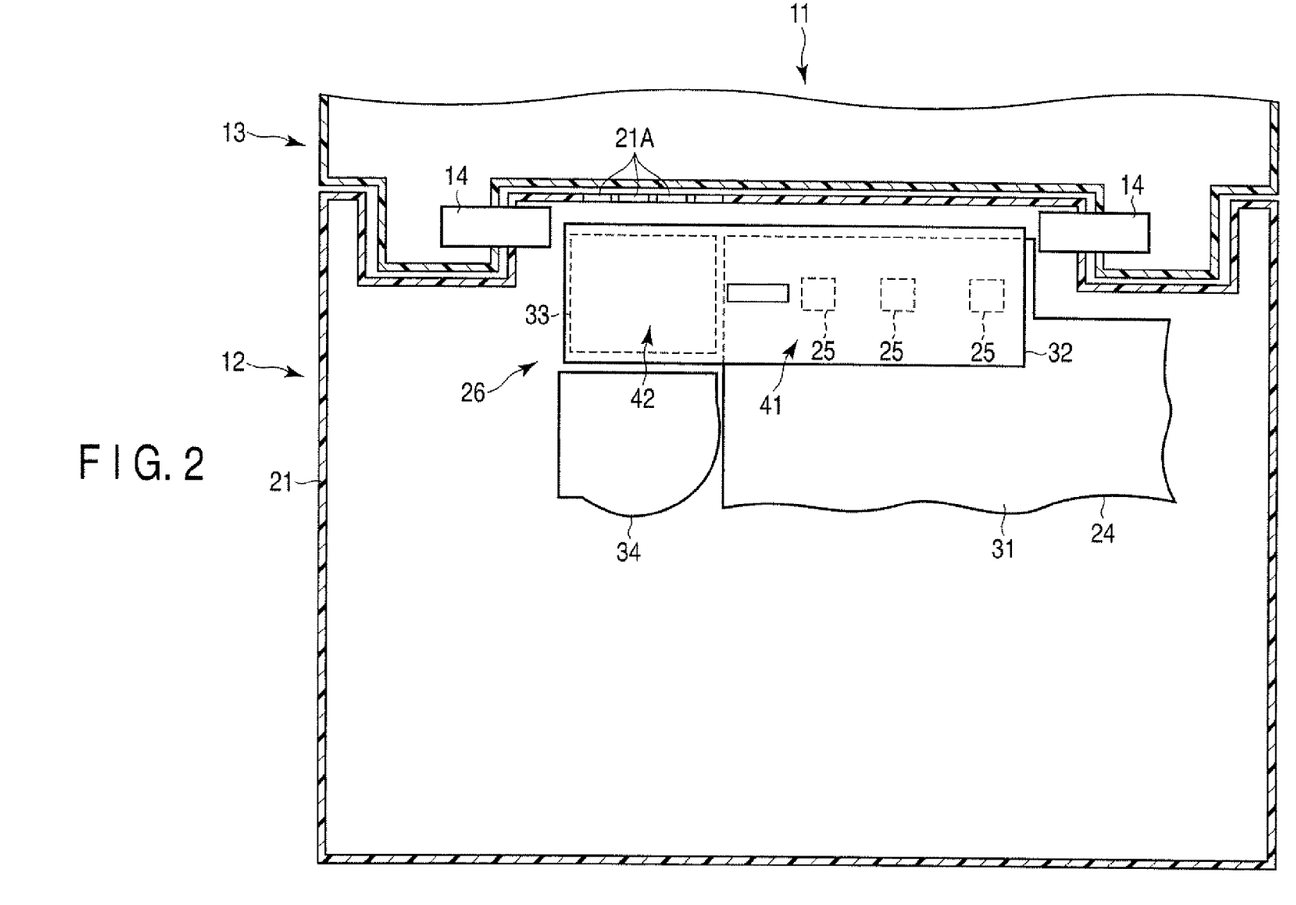
FIG. 2 is an exemplary cross sectional view of the portable computer shown in FIG. 1, taken along a horizontal direction of a housing thereof.

The display unit 13 includes a display 15. The display 15 is, for example, a liquid crystal display. As can be seen in FIGS. 1 and 2, the main body unit 12 contains a housing 21, a keyboard 22 mounted to the housing 21, a touch pad 23, a printed circuit board 24 housed inside the housing 21, and a cooling device 26 also housed inside the housing 21 in order to cool down heat generating parts 25 of the printed circuit board 24.

Figure 3:
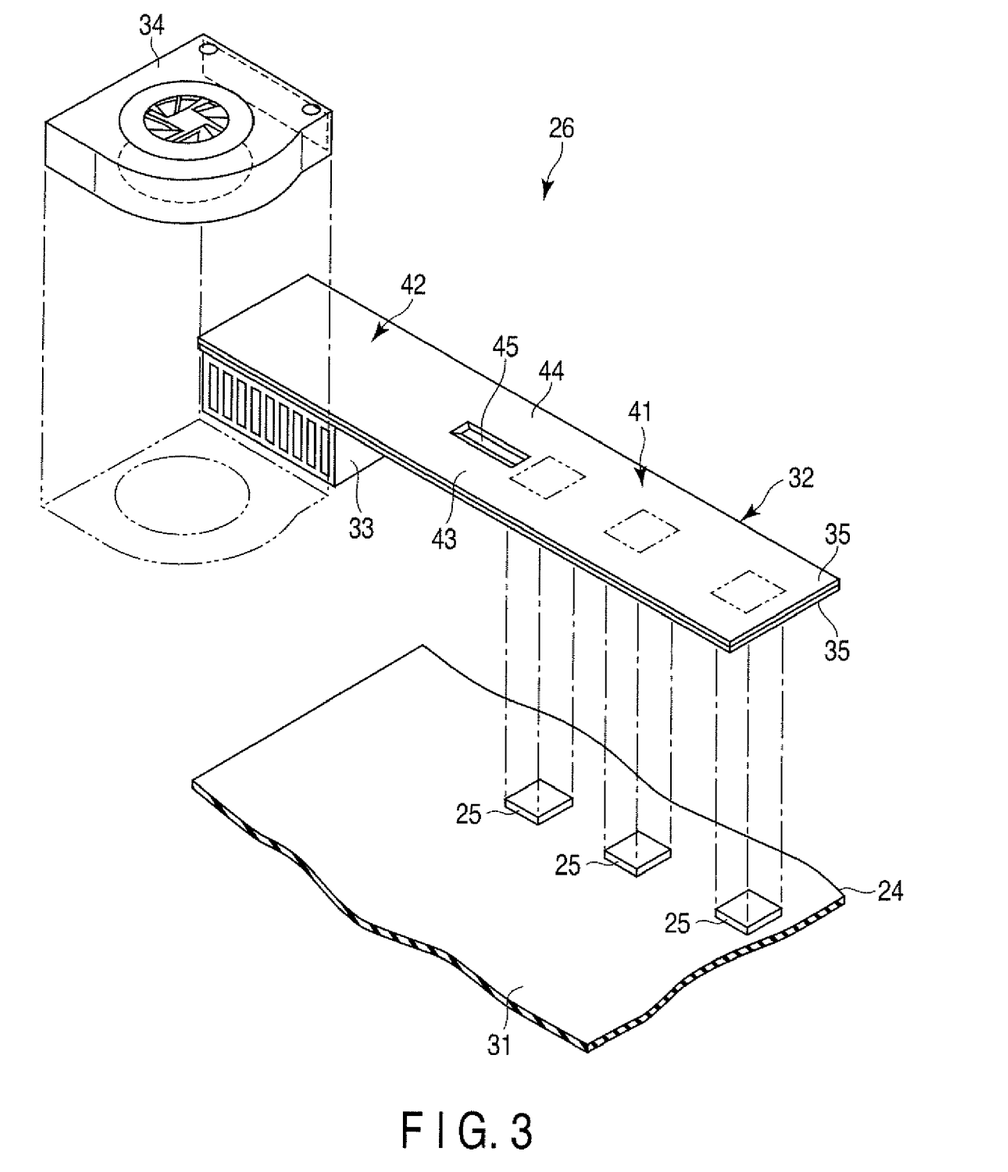
FIG. 3 is an exemplary decomposed perspective view of a cooling device housed inside the housing shown in FIG. 2.

As can be seen in FIGS. 2 and 3, the printed circuit board 24 includes a printed wiring board 31 in which a plurality of copper-made wiring layers are laminated one on another, and three heat generating parts 25 mounted on the printed circuit board 24. The three heat generating parts 25 are, for example, a central processing unit (CPU), a north bridge and a graphics chip in this embodiment, but the present invention is not limited to this configuration. The heat generating parts 25 may be some other circuit parts. Also, in this embodiment, there are three heat generating parts 25 to be cooled down with the cooling device 26, but the present invention is not limited to this configuration. For example, it is possible to have such a configuration that one heat generating part 25 is cooled down by the cooling device 26 in the embodiment.

The cooling device 26 includes a loop heat pipe 32 which cools down the heat generating parts 25, a heat sink 33 connected to a heat radiating portion of the loop heat pipe 32, and a fan unit 34 which supplies air to the heat sink 33 in order to promote the cooling down of the heat sink 33. The heat sink 33 includes, for example, a plurality of fins, and it is formed of a high heat-conductive metal such copper or aluminum alloy. It should be noted here that the cooling device 26 referred to in the present invention is of a concept which includes the heat generating parts. Also, note that the heat sink 33 is fixed to the surface of the same side connected to the heat generating parts 25, and with this structure, the cooling device 26 can be made thin.

As can be seen in FIG. 3, the loop heat pipe 32 has a flat plate shape, and it includes, as an example, an internal flow path having a loop shape within one plane. The loop heat pipe 32 is constituted as the working fluid is sealed in the internal flow path. The loop heat pipe 32 is formed by affixing two copper-made plate members 35 to each other. The two plate members 35 each have a frame portion 36 in the peripheral portion. It should be noted that the loop heat pipe 32 is formed to have a flat plate shape, but it can be bent, when it is used for such a case where heat generating parts 25 are provided at different levels, to fit the level of each of the parts appropriately.

Figure 4:
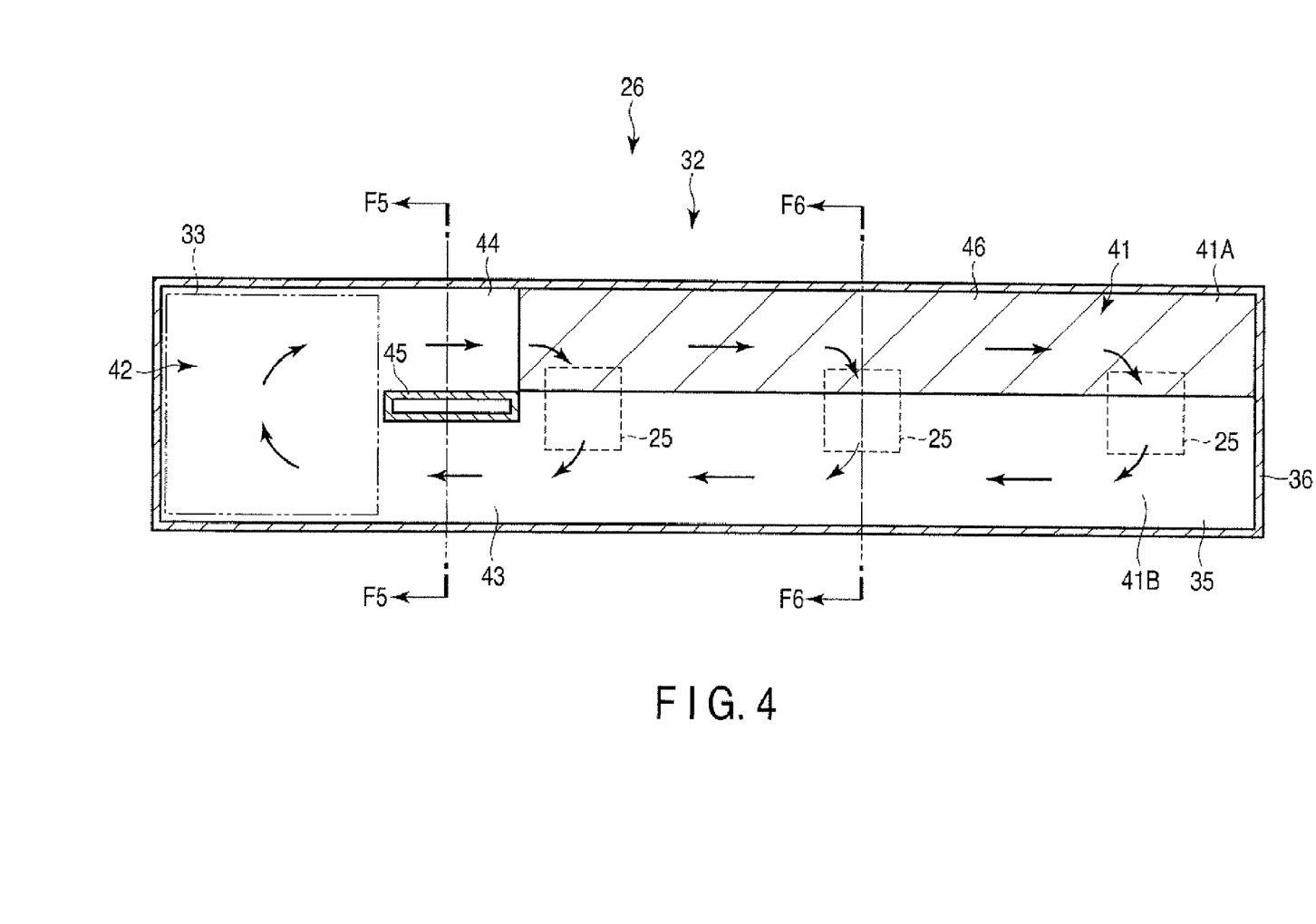
FIG. 4 is an exemplary cross sectional view of the cooling device shown in FIG. 3, taken along a horizontal direction of a loop heat pipe thereof.

As shown in FIG. 4, the loop heat pipe 32 includes a heat receiving portion 41 thermally connected to the heat generating parts 25, a heat radiating portion 42 thermally connected to the heat sink 33, the vapor flow path 43 which connects the heat receiving portion 41 and the heat radiating portion 42 to each other, the liquid returning flow path 44 which connects the heat receiving portion 41 and the heat receiving portion 42 at a position distant from the vapor flow path 43, and a partition portion which partitions the vapor flow path 43 and the liquid returning flow path 44 from each other.

The partition portion 45 is formed by subjecting one of the above-mentioned two copper-made plate members 35 to, for example, a drawing process. The method of forming the partition portion 45 is not limited to the drawing, but it is also possible to carry out brazing on one of the two plate members 35 or carry out spot welding between the two plate members 35. Further, it is also possible to form the loop heat pipe 32 by squashing a cylindrical tube. In this case, the partition portion 45 can be formed by squashing the section which gives rise to the partition portion 45 more than the section for the vapor flow path 43 or the section for the liquid returning flow path 44.

When affixing the two plate members 35 together, the partition portion 45 is arranged to abut against the other one of the plate members 35 without a gap. However, there may be a gap between the partition portion 45 and the other plate member 35, and it suffices if a vapor flow path 43 and a liquid returning flow path 44 can be substantially partitioned from each other.

The heat receiving portion 41 includes a first region 41A communicating to the liquid returning flow path 44, and a second region 41B communicating to the vapor flow path 43 in its inside. The first region 41A is provided with a wick 46 and the second region 41B is formed to be hollow.

The wick 46 is a generic name for the structure for handling the liquefied portion of the working fluid under the capillary action so as to return the working fluid from the heat radiating portion 42 to the heat receiving portion 41 in the circulation. In this embodiment, the wick 46 is formed of, for example, a porous material prepared by sintering metal powder, more specifically, copper powder to the inner side of the plate member 35. However, the wick 46 is not limited to a porous material, but it may be, for example, a metal mesh, fine groove, a wire or cloth.

Figure 6:
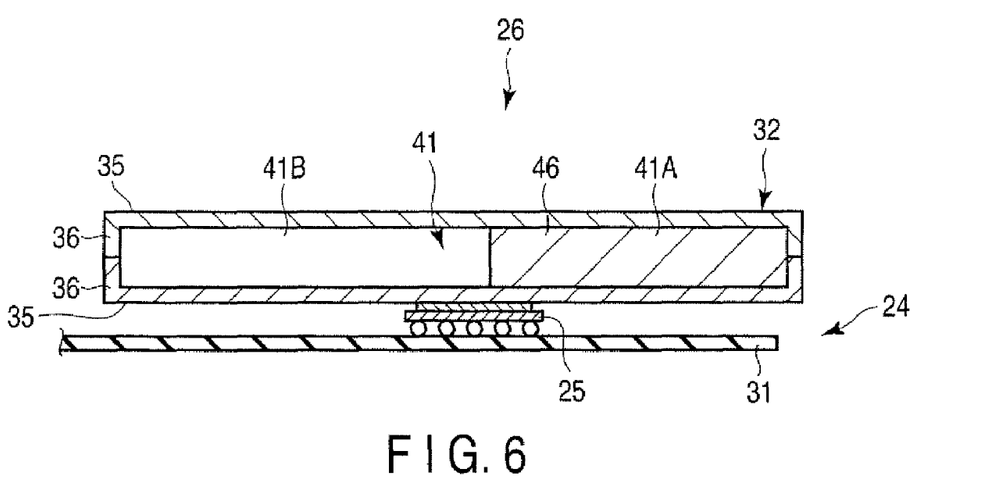
FIG. 6 is an exemplary cross sectional view of the loop heat pipe shown in FIG. 4, taken along the line F6-F6.

As shown in FIGS. 4 and 6, the heat receiving portion 41 is thermally connected to the heat generating parts 25 at a position across the first region 41A and the second region 41B. In other words, the heat generating parts 25 are arranged at displaced (offset) positions with respect to the wick 46 provided in the first region 41. More specifically, the heat receiving portion 41 is thermally connected to the heat generating parts 25 in such a manner that, for example, about ⅓ to ¼ of the area of the connection portions of the heat generating parts 25 is made to overlap with the wick 46.

The heat receiving portion 41 promotes the gasification of the working fluid at this position and thus it can deprive heat from the heat generating parts 25. Further, a thermal connection material such as grease is interposed between the heat receiving portion 41 and the heat generating parts 25.

The vapor flow path 43 has a hollow portion in its inside and it allows the gasified portion of the working fluid to flow from the heat receiving portion 41 towards the heat radiating portion 42. The liquid returning flow path 44 is provided independently from the vapor flow path 43. The liquid returning flow path 44 has a hollow portion in its inside and it allows the working fluid to flow from the heat radiating portion 42 towards the heat receiving portion 41. The heat radiating portion 42 has a hollow portion in its inside and it is fixed to the heat sink on an outer surface. The heat radiating portion 42 promotes the liquefying of the working fluid at this position and thus it can release the heat transmitted from the heat receiving portion 41 to the outside, that is, the heat sink 33

The working fluid changes its phase between liquid and gas. The working fluid is, for example, water. However, the working fluid is not limited to water, but it may be, for example, ethanol, ammonium or butane.

It should be noted that the heat transport amount of the loop heat pipe 32 has been dramatically improved as compared to the case of a conventional rod-type heat pipe, and therefore it cannot be compared with the conventional type on the same basis. More specifically, the heat transfer amount of the conventional rod-type heat pipe (having an outer diameter of 3 mm) is, for example, about 30 W, whereas the heat transfer amount of the loop heat pipe 32 (having a thickness of 1.2 mm) of this embodiment is, for example, about 90 W.

Figure 5:
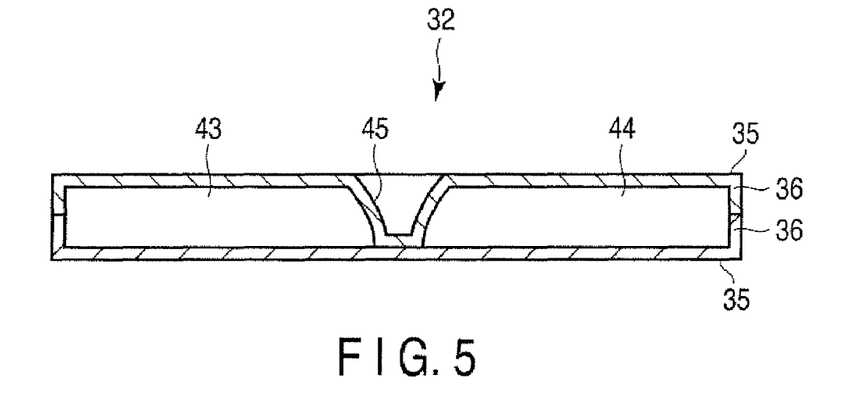
FIG. 5 is an exemplary cross sectional view of the loop heat pipe shown in FIG. 4, taken along the line F5-F5.

The operation of the cooling device 26 of this embodiment will now be described with reference to FIGS. 4 to 6. As shown in FIGS. 4 and 6, the heat generated in the heat generating parts 25 is transferred to the heat receiving portion 41 of the loop heat pipe 32. Here, in the heat receiving portion 41, the gasification of the working fluid is promoted, and due to the gasification, the heat of the heat generating parts 25 is taken into the loop heat pipe 32. Here, the gasification of the working fluid occurs mainly on the surface where the wick 45 is brought into contact with the second region 41B, that is, the boundary surface between the first region 41A and the second region 41B. In the border line section between the first region 41A of the heat receiving portion 41 and the liquid returning flow path 44, which is located distant from the heat generating parts 25, the gasification does not occur.

The gasified portion of the working fluid, which is created in the heat receiving portion 41 is sent to the heat radiating portion 42 via the vapor flow path 43 as indicated by an arrow in FIG. 4. In the heat radiating portion 42, the heat of the working fluid is transferred to the heat sink 33, and thus the liquefying of the working fluid is promoted. The liquefied portion of the working fluid, created in the heat radiating portion 42 is sent to the heat receiving portion 41 via the liquid returning flow path 44 as indicated by an arrow in FIG. 4. In this manner, the working fluid is circulated within the loop heat pipe 32, and the transfer of heat is smoothly performed. The heat transmitted to the heat sink 33 is propagated to the air by a blow from the fan unit 34. The air is discharged to the outside of the housing 21 via the through hole 21A formed in the housing 21.

According to this embodiment, the portable computer 11, which is an example of the electronic devices, comprises the housing 21; the heat generating parts 25 housed inside the housing 21; and the loop heat pipe 32 housed inside the housing 21 and formed by sealing the working fluid in the loop-shaped internal flow path, wherein the loop heat pipe 32 further comprises the heat receiving portion 41 thermally connected to the heat generating parts 25; the heat radiating portion 42 which release the heat transmitted from the heat receiving portion 41 to the outside; the vapor flow path 43 which connects the heat receiving portion 41 and the heat radiating portion 42 to each other and allows the gasified portion of the working fluid created by the heat receiving portion 41 to flow to the heat radiating portion 42; and the liquid return flow path 44, provided independently from the vapor flow path 43, which connects the heat receiving portion 41 and the heat radiating portion 42 to each other and allows the liquefied portion of the working fluid created by the heat radiating portion 42 to flow to the heat receiving portion 41, and the heat receiving portion 41 includes the first region 41A communicating to the liquid return flow path 44 and provided with the wick 46, and the second region 41B communicating to the vapor flow path 43 and formed to be hollow, and is thermally connected to the heat generating parts at positions across the first region 41A and the second region 41B.

With the above-described structure, the gasification of the working fluid can be promoted in the boundary portion between the wick 46 and the second region 41B. In the meantime, the boundary portion between the wick 46 and the liquid return flow path 44 is located at a position remote from the heat generating parts 25, and thus the temperature of the boundary portion can be made low. Therefore, it is possible to prevent the working fluid from being gasified from this portion. Further, when the boundary portion between the wick 46 and the liquid return flow path 44 is located at a position remote from the heat generating parts 25, the pressure loss in this direction can be increased, and it is possible to prevent bubbles of the evaporated portion of the working fluid from flowing in this direction. From the two respects described above, the occurrence of a back-flow in the working fluid can be prevented. In this manner, the portable computer 11 comprising the loop heat pipe 32 which can cool down the heat generating parts 25 efficiently with a simple structure can be provided. Further, since the heat generating parts 25 are arranged such as to partially overlap with the wick 46, the heat conductivity from the heat generating parts 25 to the wick 46 is improved, and therefore the heat generating parts 25 can be efficiently cooled down.

In this embodiment, the wick 46 is a porous material prepared by sintering metal powder. With this structure, the liquefied portion of the working fluid can be guided in a direction against the gravity by utilizing the capillary action of the porous material, and therefore the loop heat pipe 32 can be set free from its angle dependency, in which the cooling performance depends on the set angle of the loop heat pipe 32.

In this embodiment, there are a plurality number of heat generating parts 25, and these heat generating parts 25 are arranged on the border line between the first region 41A and the second region 41B. With this structure, a plurality of heat generating parts 25 can be arranged at positions across the first region 41A and the second region 41B. Thus, the device is able to smoothly handle multiple cooling in which a plurality of heat generating parts 25 are cooled down altogether. In other words, by securing a sufficient length of the boundary line between the first region 41A and the second region 41B and arranging the heat generating parts 25 side by side on this border line, it becomes possible to handle the cooling of a plurality of heat generating parts 25 flexibly. That is, even in the case of a portable computer including two heat generating parts or a portable computer including four heat generating parts, the loop heat pipe 32 can be commonly used, and thus the loop heat pipe 32 can be versatile.

Figure 7:
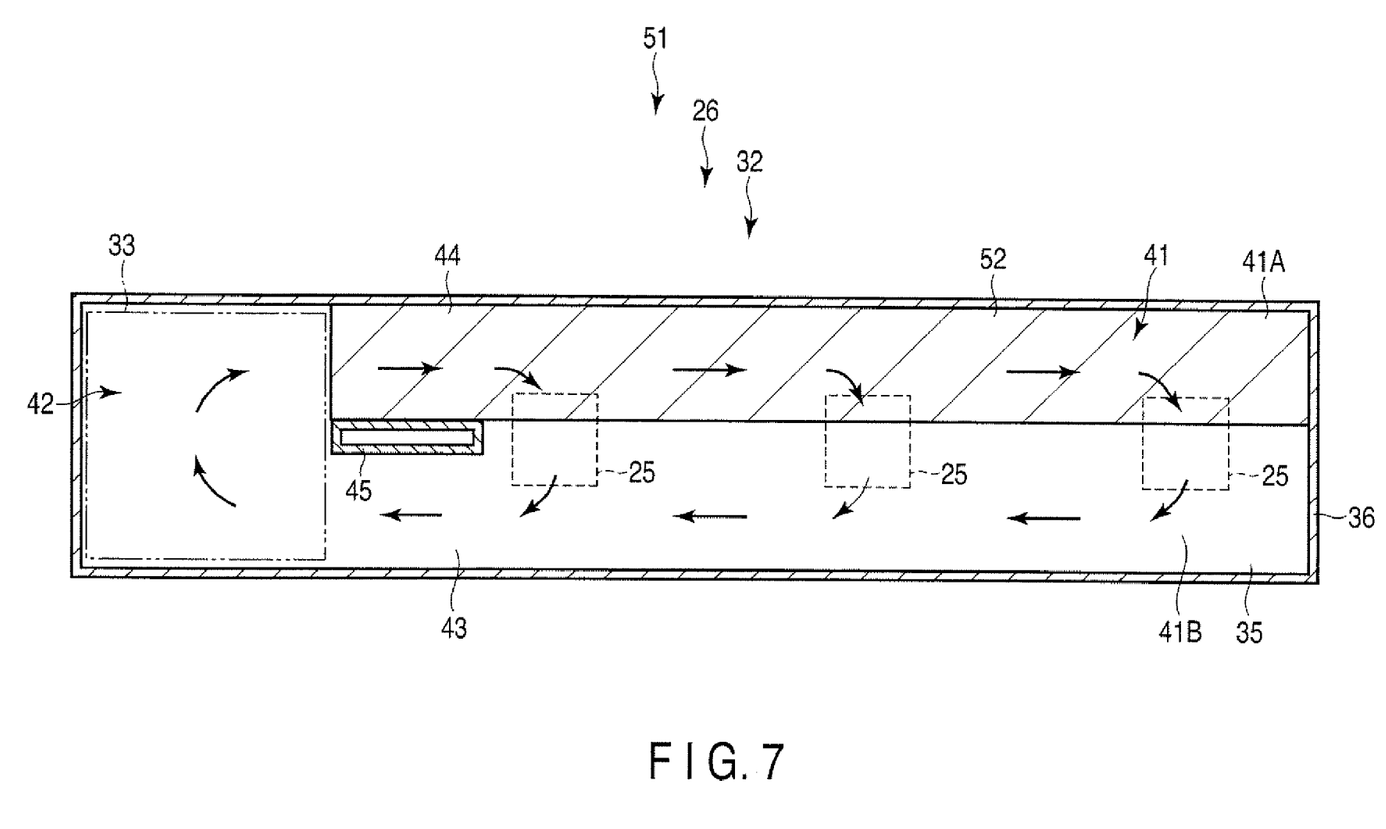
FIG. 7 is an exemplary cross sectional view of a portable computer, which is an example of the electronic device according to the second embodiment, taken along a horizontal direction of a loop heat pipe thereof.

Next, with reference to FIG. 7, the second embodiment of the electronic device will now be described. A portable computer 51, which is an example of the electronic device of the second embodiment, is different from that of the first embodiment only in the structure of a wick 52, and the other parts are common. Therefore, the following descriptions are made in connection with the part different from that of the first embodiment. Parts common to both embodiments are designated by the same reference numerals, and the descriptions for these parts will be omitted.

The wick 52 of the second embodiment is formed of, for example, a porous material prepared by sintering metal powder, more specifically, copper powder to the inner side of the plate member 35. The wick 52 is provided in the first region 41A of the heat receiving portion 41 and the inside of the liquid returning flow path 44. The wick 52 is formed continuously to extend from the first region 41A of the heat receiving portion 41 to the inside of the liquid returning flow path 44.

According to the second embodiment, the wick 52 is formed to continue as it extends from the first region 41A to the inside of the liquid returning flow path 44. With this structure, the liquefied portion of the working fluid inside the liquid returning flow path 44 can be suctioned even up to the heat receiving portion 41, and therefore the angle dependency of the loop heat pipe 32 can be further decreased. In this manner, it becomes possible to provide the loop heat pipe 32, which is appropriate for not only the portable computer 51 but also a device whose set angle varies, such as tablet-type notebook computer or a mobile information terminal.

Further, since the wick 52 is formed to continue to the inside of the liquid return flow path 44, the boundary portion between the wick 52 and the heat radiating portion 42 can be located at a position remote from the heat generating parts 25. In this manner, it is possible to prevent the working fluid from being gasified from the boundary portion between the wick 52 and the heat radiating portion 42, and therefore the back-flow of the working fluid can be prevented.

Figure 8:
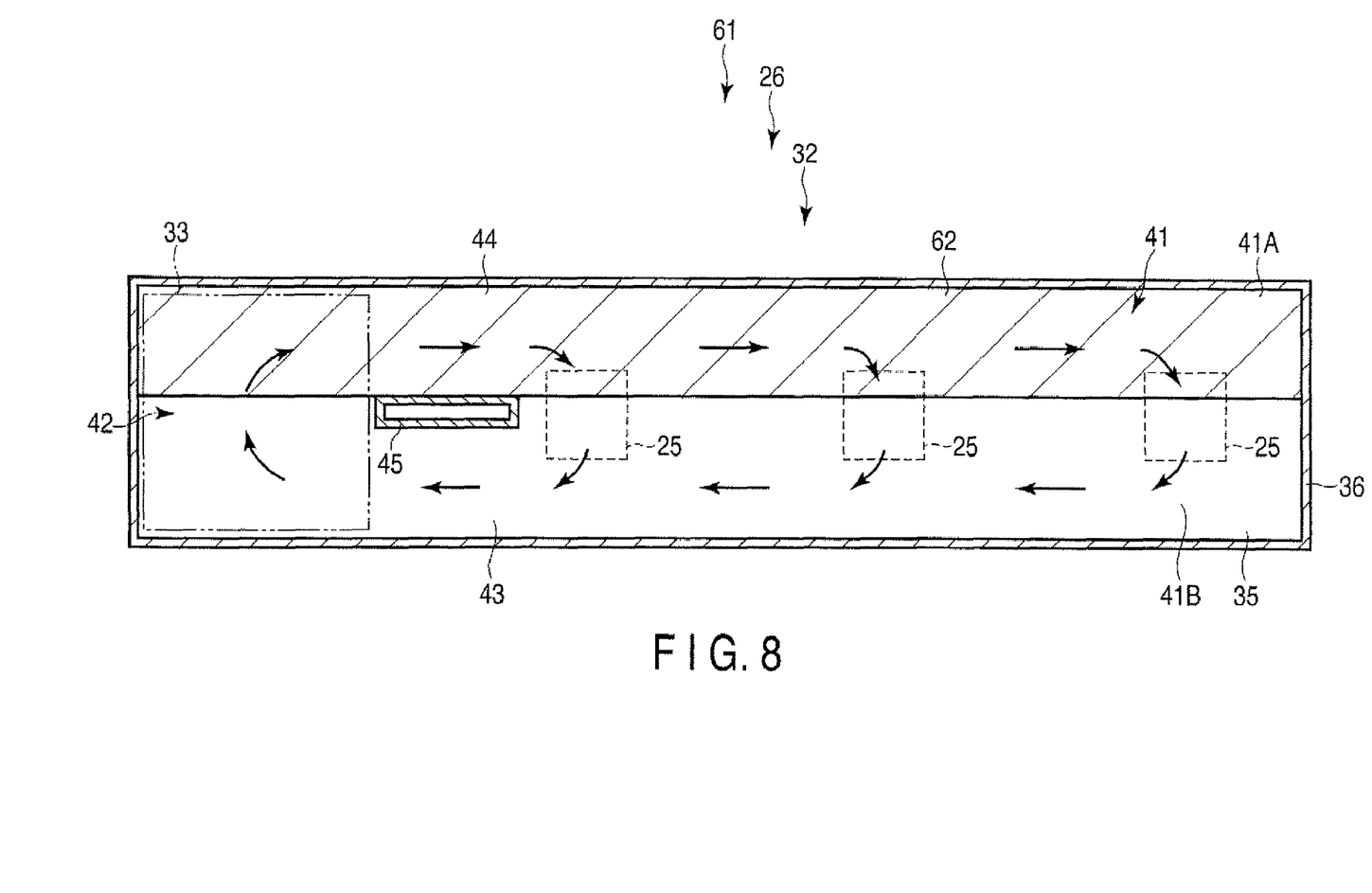
FIG. 8 is an exemplary cross sectional view of a portable computer, which is an example of the electronic device according to the second embodiment, taken along a horizontal direction of a loop heat pipe thereof.

Next, with reference to FIG. 8, the third embodiment of the electronic device will now be described. A portable computer 61, which is an example of the electronic device of the third embodiment, is different from that of the first embodiment only in the structure of a wick 62, and the other parts are common. Therefore, the following descriptions are made in connection with the part different from that of the first embodiment. Parts common to both embodiments are designated by the same reference numerals, and the descriptions for these parts will be omitted.

The wick 62 of the third embodiment is formed of, for example, a porous material prepared by sintering metal powder, more specifically, copper powder to the inner side of the plate member 35. The wick 62 is provided in the first region 41A of the heat receiving portion 41, the inside of the liquid returning flow path 44 and a section of the inside of the heat radiating portion 42. The wick 62 is formed continuously to extend from the first region 41A of the heat receiving portion 41, passing through the inside of the liquid returning flow path 44, and to the inside of the heat radiating portion 42.

According to the third embodiment, the wick 62 is formed to continue as it extends from the liquid returning flow path 44 to the inside of the heat radiating portion 42. With this structure, the liquefied portion of the working fluid inside the liquid return flow path 44 can be conveyed in a direction against the gravity and thus the working fluid can be suctioned up to the heat receiving portion via the wick 62. Further, with this structure, the wick 62 is made of a porous material, and therefore even when the heat receiving portion 41 is set at a position higher than that of the heat radiating portion 42 to create a top heat state in which the device is arranged in a vertical direction, the degradation of the performance of the loop heat pipe 32 can be suppressed to about 10%. Furthermore, it is also possible to prevent the working fluid from moving in an unintended direction, which is caused by holding the liquefied portion of the working fluid within the heat radiating portion 42 by the wick 62. In this manner, it becomes possible to provide the loop heat pipe 32, which is appropriate for not only the portable computer 61 but also a device whose set angle varies, such as tablet-type notebook computer or a mobile information terminal.

Still furthermore, in this embodiment, the wick 62 is located at a position where it partially overlaps with the heat sink 33. With this structure, the heat conductivity is improved at this section, and the transfer of the heat from the loop heat pipe 32 to the heat sink 33 can be efficiently carried out.

The electronic device of the present invention is not limited to the portable computer 11, 51 or 61 described above, but the electronic device can be remodeled into various versions as long as it does not fall out of the scope of the invention.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic device comprising:
a housing;
a plurality of heat generating parts contained in the housing; and
a loop heat pipe contained in the housing and formed by sealing an operating fluid in an annular internal fluid path,
the loop heat pipe comprising:
a heat receiving portion thermally connected to the heat generating parts;
a heat radiating portion configured to release the heat transmitted from the heat receiving portion to the outside;
a vapor flow path which connects the heat receiving portion and the heat radiating portion to each other, and through which the operating fluid evaporated by the heat receiving portion flows to the heat radiating portion; and
a liquid return flow path which is provided independently of the vapor flow path and connects the heat receiving portion and the heat radiating portion to each other, and through which the fluid flows to the heat receiving portion, and
the heat receiving portion further comprises a first region connected to the liquid return flow path and provided with a wick, and a second region formed to be hollow and connected to the vapor flow path, and is thermally connected to the heat generating parts at a position across the first region and the second region,
the heat generating parts are arranged in line on a border line between the first region and the second region.

2. The electronic device of claim 1, wherein the wick is formed continuously to extend from the first region to an inside of the liquid return flow path.

3. The electronic device of claim 2, wherein the wick is formed continuously to extend from the liquid return flow path to an inside of the heat radiating portion.

4. A cooling device comprising:
a loop heat pipe formed by sealing an operating fluid in an annular internal fluid path and comprising a heat receiving portion and a heat radiating portion;
a plurality of heat generating parts thermally connected to the heat receiving portion;
a heat sink which promotes heat radiation in the heat radiating portion; and
a fan unit which supplies an air blow to the heat sink,
wherein the loop heat pipe further comprises:
the heat radiating portion which releases the heat transmitted from the heat receiving portion to the outside;
a vapor flow path which connects the heat receiving portion and the heat radiating portion to each other and through which the operating fluid evaporated by the heat receiving portion flows to the heat radiating portion; and
a liquid return flow path which is provided independently of the vapor flow path, and connects the heat receiving portion and the heat radiating portion to each other, and through which the fluid flows to the heat receiving portion, and
the heat receiving portion further comprises a first region connected to the liquid return flow path and provided with a wick, and a second region formed to be hollow and connected to the vapor flow path, and is thermally connected to the heat generating parts at a position across the first region and the second region,
the heating generating parts are arranged in line on a border line between the first region and the second region.

5. The cooling device of claim 4, wherein the wick is formed continuously to extend from the first region to an inside of the liquid return flow path.

6. The cooling device of claim 5, wherein the wick is formed continuously to extend from the liquid return flow path to an inside of the heat radiating portion.

7. An electronic device comprising:
a housing;
a first heat generating part contained in the housing;
a second heat generating part contained in the housing; and
a loop heat pipe in which an operating fluid is sealed and which comprises: a heat receiving portion configured to receive heat from the first heat generating part and the second heat generating part; a heat radiating portion configured to release the heat transmitted from the heat receiving portion; a second flow path connecting the heat receiving portion and the heat radiating portion to each other and provided with a wick; and a first flow path connecting the heat receiving portion and the heat radiating portion to each other and provided independently of the second flow path,
wherein the heat receiving portion of the loop heat pipe includes a first region in which the wick extends to the second flow path, and a second region connected to the first flow path, the first heat generating part and the second heat generating part are thermally connected to the heat receiving portion at a position across the first region and the second region, and the first heat generating part and the second heat generating part are arranged in line on a border line between the first region and the second region.

8. The electronic device of claim 7, wherein the wick continuously extends from the second flow path to an inside of the heat radiating portion.

* * * * *